US009293223B2

(12) United States Patent
Ma

(10) Patent No.: US 9,293,223 B2
(45) Date of Patent: Mar. 22, 2016

(54) SHIFT REGISTER UNIT, GATE DRIVING CIRCUIT AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/372,385

(22) PCT Filed: Jul. 18, 2013

(86) PCT No.: PCT/CN2013/079611
§ 371 (c)(1),
(2) Date: Jul. 15, 2014

(87) PCT Pub. No.: WO2014/173025
PCT Pub. Date: Oct. 30, 2014

(65) Prior Publication Data
US 2015/0043704 A1    Feb. 12, 2015

(30) Foreign Application Priority Data

Apr. 22, 2013  (CN) .......................... 2013 1 0139339

(51) Int. Cl.
*G11C 19/00*    (2006.01)
*G11C 27/04*    (2006.01)
(Continued)

(52) U.S. Cl.
CPC .............. *G11C 27/04* (2013.01); *G09G 3/3648* (2013.01); *G09G 3/3677* (2013.01); *G11C 19/28* (2013.01); *G09G 2310/0286* (2013.01); *G09G 2320/0219* (2013.01)

(58) Field of Classification Search
None
See application file for complete search history.

(56) References Cited

U.S. PATENT DOCUMENTS 6,339,631 B1 *  1/2002  Yeo et al. ......................... 377/64
7,573,971 B2 *  8/2009  Tseng et al. ..................... 377/64
(Continued)

FOREIGN PATENT DOCUMENTS

CN    101777386 A    7/2010
CN    102117607 A    7/2011
(Continued)

OTHER PUBLICATIONS

English Translation of the International Search Report of PCT/CN2013/079611 published in English on Oct. 30, 2014.
(Continued)

*Primary Examiner* — Tuan T Lam
(74) *Attorney, Agent, or Firm* — Collard & Roe, P.C.

(57) ABSTRACT

A shift register unit comprises a pull-up control module (1), a pull-up module (2), a pull-down control module (3) and a pull-down module (4), the pull-up control module (1) is connected to a first clock signal terminal (CLK1), a first voltage signal terminal (V1), a second voltage signal terminal (V2) and a pull-up control node (Aj), the pull-up module (2) is connected to the pull-up control node (A), the first voltage signal terminal (V1) and a signal output terminal (OUTPUT) of present stage, the pull-down control module (3) is connected to a second clock signal terminal (CLK2), a signal input terminal (INPUT) and a pull-down control node (B), and the pull-down module (4) is connected to the pull-down control node (B), the first clock signal terminal (CLK1) and the signal output terminal (OUTPUT) of present stage. There also disclose a gate driving circuit and a display device. The shift register unit can ameliorate a potential suspension problem existing in nodes of the shift register unit, so as to improve stability of an output signal.

13 Claims, 3 Drawing Sheets

(51) Int. Cl.
    *G11C 19/28*    (2006.01)
    *G09G 3/36*    (2006.01)

(56) References Cited

U.S. PATENT DOCUMENTS

| | | | |
|---|---|---|---|
| 7,697,655 B2 * | 4/2010 | Chan et al. | 377/64 |
| 2005/0220263 A1 * | 10/2005 | Moon | 377/68 |
| 2005/0264505 A1 * | 12/2005 | Kim | 345/87 |
| 2007/0019775 A1 * | 1/2007 | Tsai et al. | 377/64 |
| 2007/0236421 A1 * | 10/2007 | Shin | 345/76 |
| 2007/0240024 A1 * | 10/2007 | Shin | 714/726 |
| 2009/0167741 A1 | 7/2009 | Tsai | |
| 2011/0150169 A1 | 6/2011 | Lin et al. | |
| 2012/0133574 A1 | 5/2012 | Wu et al. | |
| 2012/0294411 A1 * | 11/2012 | Duan | 377/64 |
| 2014/0064438 A1 * | 3/2014 | Wu et al. | 377/64 |

FOREIGN PATENT DOCUMENTS

| | | |
|---|---|---|
| CN | 102479477 A | 5/2012 |
| CN | 102629463 A | 8/2012 |
| CN | 103000120 A | 3/2013 |
| CN | 103000155 A | 3/2013 |
| CN | 103151010 A | 6/2013 |

OTHER PUBLICATIONS

First Office Action and Search Report by the State Intellectual Property Office of the People's Republic of China for Chinese Patent Application 201310139339.5, written on Sep. 12, 2014 in Chinese (English text included).

Patent Grant Notification by the State Intellectual Property Office of the People's Republic of China for Chinese Patent Application 201310139339.5, issuing date Dec. 17, 2014 in Chinese (English text included).

Patent Issued by the State Intellectual Property Office of the People's Republic of China for Chinese Patent Application 201310139339.5, which received Chinese Patent No. CN 103280200 B which issued on Jan. 21, 2015 in Chinese.

Allowed claims of Chinese Patent Application 201310139339.5 in Chinese with English translation.

International Search Report, International Preliminary Report on Patentability and Written Opinion of the International Searching Authority of PCT/CN2013/079611 in Chinese, mailed Jan. 23, 2014.

English translation of the International Preliminary Report on Patentability and Written Opinion of the International Searching Authority of PCT/CN2013/079611, issued Oct. 27, 2015.

* cited by examiner

SHIFT REGISTER UNIT, GATE DRIVING CIRCUIT AND DISPLAY DEVICE

CROSS REFERENCE TO RELATED APPLICATIONS

This application is the National Stage of PCT/CN2013/079611 filed on Jul. 18, 2013, which claims priority under 35 U.S.C. §119 of Chinese Application No. 201310139339.5 filed on Apr. 22, 2013, the disclosure of which is incorporated by reference.

TECHNICAL FIELD

The present disclosure relates to the technical field of display driving circuit, in particular to a shift register unit, a gate driving circuit and a display device.

BACKGROUND

A liquid crystal display (LCD) has been widely applied to products or components having a display function including a mobile phone, a tablet computer, a TV set, a display, a notebook computer, a camera, a video camera, a digital photo frame, and a navigator and so on due to its advantages of low power consumption, light weight, thin thickness, non electromagnetic radiation and pollution-free and so on.

In the existing liquid crystal display, the pixel array can comprise gate scanning lines and series data lines vertically and horizontally crossed with each other. Herein, in order to realize a progressively scanning of the pixel array, a gate line driving circuit is usually adopted to provide a scanning signal to the gate scanning line of the pixel array.

The existing gate driving circuit usually adopts a design of gate driver on array (GOA) to integrate a gate switch circuit of a thin film transistor (TFT) on the array substrate of the display panel, so as to form a scanning driving for the display panel. Such a gate switch circuit integrated on the array substrate by using the GOA technique is also referred to as a GOA circuit or a shift register circuit.

At present, a structure of a shift register unit which is commonly used can be shown in FIG. 1. The shift register unit mainly comprises six transistors and one capacitor (6T1C). By taking the six transistors being P-type transistors as an example, such kind of shift register unit can be controlled by adopting two clock signals (CLK1, CLK2) having inverse phases, wherein the clock signal CLK1 is used for controlling turn-on or turn-off of transistors M1 and M2, and the clock signal CLK2 is used for controlling turn-on or turn-off of a transistor M3. When the transistor M1 is in a turn-on state, a frame start signal STV can control the turn-on or turn-off of transistors M4 and M5. When the transistor M2 is in a turn-on state, a low voltage signal VGL turns on a transistor M6 through the transistor M2, and a high voltage signal VGH at this time can be outputted to an output terminal OUTPUT of the shift register unit through the transistor M6.

Such a kind of shift register unit has the following deficiency: when the shift register unit operates at different phases, some key nodes inside the shift register unit (such as nodes A, B and C in FIG. 1) will produce a potential suspension phenomenon due to the effect of residual potential at the previous phase, thereby having influence on an output signal at the output terminal, and causing the output signal unstable.

SUMMARY

Embodiments of the present disclosure provides a shift register unit, a gate driving circuit and a display device, which can ameliorate a potential floating problem existing in nodes of the shift register unit, so as to improve stability of an output signal.

In order to solve the above technical problem, the embodiments of the present disclosure adopt following technical solutions:

An aspect of the embodiments of the present disclosure provides a shift register unit comprising a pull-up control module, a pull-up module, a pull-down control module and a pull-down module, wherein the pull-up control module is connected to a first clock signal terminal, a first voltage signal terminal, a second voltage signal terminal and a pull-up control node, and configured to control a potential at the pull-up control node;

the pull-up module is connected to the pull-up control node, the first voltage signal terminal and a signal output terminal of present stage and configured to pull up a signal outputted from the signal output terminal of present stage to a high potential when the pull-up module is controlled by a signal at the pull-up control node to be in a turn-on state and a signal at the first voltage signal terminal is at a high level;

the pull-down control module is connected to a second clock signal terminal, a signal input terminal and a pull-down control node and configured to control a potential at the pull-down control node;

the pull-down module is connected to the pull-down control node, the first clock signal terminal and the signal output terminal of present stage and configured to pull down the signal outputted from the signal output terminal of present stage to a low potential when the pull-down module is controlled by the signal at the pull-down control node to be in a turn-on state and a signal outputted from the first clock signal terminal is at a low level.

A further aspect of the embodiments of the present disclosure provides a gate driving circuit comprising a plurality of above shift register units connected in series; except for a last stage of shift register unit among the shift register units, a signal output terminal of present stage for each of the other shift register units is connected to an signal input terminal of its adjacent next stage of shift register unit.

A further aspect of the embodiments of the present disclosure provides a display device comprising the above gate driving circuit.

The shift register unit, the gate driving circuit and the display device of the embodiments of the present disclosure can ameliorate the potential floating problem existing in the nodes of the shift register unit, so as to enhance stability of the output signal.

BRIEF DESCRIPTION OF THE DRAWINGS

In order to specify technical solutions in embodiments of the disclosure more clearly, the accompanying figures needed to be used in the description of the embodiments or the prior art will be simply introduced below. Obviously, the figures described below are just some embodiments of the present disclosure, and other figures can further be obtained according to these figures without paying any inventive labor for those skilled in the art.

DETAILED DESCRIPTION

Technical solutions in the embodiments of the present disclosure will be clearly and completely described below in combination with the accompanying figures. Apparently, the embodiments described below are just a part of embodiments of the present disclosure rather than all the embodiments. Based on the embodiments in the present disclosure, all the other embodiments obtained by those skilled in the art without doing inventive work belong to the scope sought for protection in the present disclosure.

Transistors adopted in the embodiments of the present disclosure can be thin film transistors or field effect transistors or other devices with the same characteristics. Since sources and drains of the transistors adopted herein are symmetrical, their sources and drains have no difference. In the embodiments of the present disclosure, in order to differentiate the two electrodes other than a gate, a source is referred to as a first electrode, and a drain is referred to as a second electrode. It is specified according to patterns in the figures that a middle terminal of a transistor is a gate, a signal input terminal is a source, and a signal output terminal is a drain. In addition, transistors can be categorized into N-type and P-type depending on characteristic of the transistors. The transistors in the structure of the embodiments of the present disclosure are specified by taking P-type transistors as an example. The P-type transistor has a characteristic of the transistor being turned on when a gate electrode is inputted a low voltage. It can be considered that adopting the N-type transistor to implement is easily conceivable for those skilled in the art without paying any inventive labor, and thus falls into the protection scope of the embodiments of the present disclosure.

Figure 1:
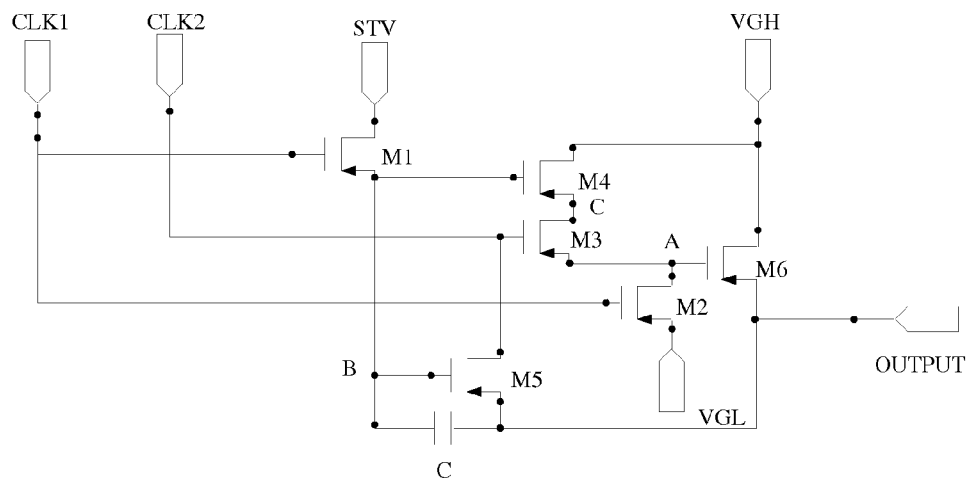
FIG. 1 is a schematic diagram of a circuit connecting structure of a shift register unit as known in the art.
Figure 2:
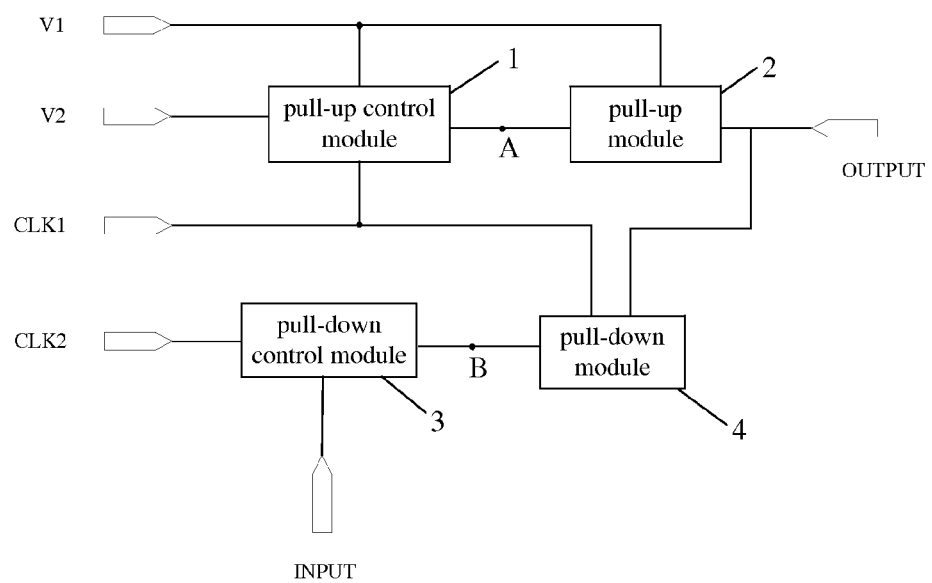
FIG. 2 is a schematic diagram of a structure of a shift register unit in an embodiment of the present disclosure.

There is shown in FIG. 2 a structure of a shift register unit in embodiments of the present disclosure, comprising a pull-up control module 1, a pull-up module 2, a pull-down control module 3 and a pull-down module 4.

Herein, the pull-up control module 1 is connected to a first clock signal terminal CLK1, a first voltage signal terminal V1, a second voltage signal terminal V2 and a pull-up control node A, and configured to control a potential at the pull-up control node A.

The pull-up module 2 is connected to the pull-up control node A, a first voltage signal terminal V1 and a signal output terminal OUTPUT of present stage, and configured to pull up a signal outputted from the signal output terminal OUTPUT of present stage to a high potential when a signal at the pull-up control node A controls the pull-up module 2 to be in a turn-on state and a signal at the first voltage signal terminal V1 is at a high level.

The pull-down control module 3 is connected to a second clock signal terminal CLK2, a signal input terminal INPUT and a pull-down control node B, and configured to control a potential at the pull-down control node B.

The pull-down module 4 is connected to the pull-down control node B, the first clock signal terminal CLK1 and the signal output terminal OUTPUT of present stage, and configured to pull down the signal outputted from the signal output terminal OUTPUT of present stage to a low potential when the signal at the pull-down control node B controls the pull-down module 4 to be in a turn-on state, and a signal outputted from the first clock signal terminal CLK1 is at a low level.

The shift register unit in the embodiment of the present disclosure can ameliorate the potential suspension problem existing in some key points in the shift register unit, so as to improve stability of the output signal.

It needs to specify that in the embodiment of the present disclosure, the first voltage signal terminal V1 can be inputted a high voltage VGH and the second voltage signal terminal V2 can be inputted a low voltage VGL.

Figure 3:
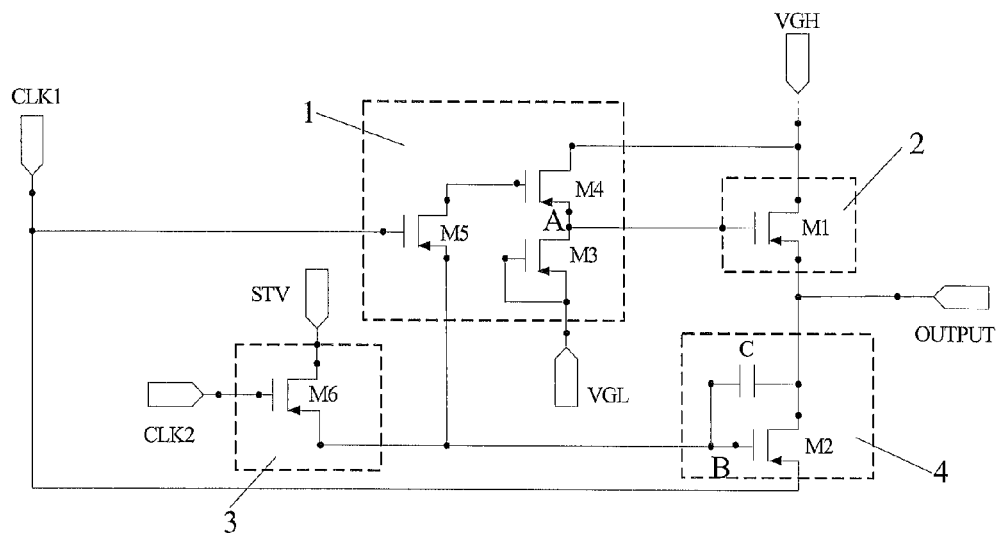
FIG. 3 is a schematic diagram of a circuit connecting structure of a shift register unit in an embodiment of the present disclosure.

Further, as shown in FIG. 3, the pull-up module 2 can comprise: a first transistor M1, whose gate is connected to the pull-up control node A, first electrode is connected to the signal output terminal OUTPUT of present stage, and second electrode is connected to the first voltage signal terminal V1 (VGH), so that the first transistor M1 can be controlled to be turned on or turned off through the potential at the pull-up control node A. When the pull-up control node A is at a low potential, the first transistor M1 is turned on, and at this time, the first voltage signal V1 can pull up the signal at the signal output terminal OUTPUT of present stage to the high potential through the first transistor M1.

Further, the pull-down module 4 can comprise:

a second transistor M2, whose gate is connected to a pull-down control node B, first electrode is connected to the first clock signal terminal CLK1, and second electrode is connected to the signal output terminal OUTPUT of present stage; and a capacitor C, connected in parallel between the gate and second electrode of the second transistor M2.

Such a structure can control the second transistor M2 to be turned on or turned off by controlling a potential at the pull-down control node B. The second transistor M2 is turned on when the pull-down control node B is at a low potential, and at this time, the signal at the first clock signal terminal CLK1 can be inputted to the signal output terminal OUTPUT of present stage through the second transistor M2.

The capacitor C can store the potential at the pull-down control node B to control the second transistor M2 to be turned on or turned off in the next phase.

Further, the pull-up control module 1 can comprise: a third transistor M3, whose gate and first electrode are connected to the second voltage signal terminal V2 (VGL), and second electrode is connected to the pull-up control node A; a fourth transistor M4, whose first electrode is connected to the pull-up control node A, and second electrode is connected to the first voltage signal terminal V1; a fifth transistor M5, whose gate is connected to the first clock signal terminal CLK1, first electrode is connected to the pull-down control node B, and second electrode is connected to a gate of the fourth transistor M4.

In the pull-up control module 3 of this structure, the signal at the first clock signal terminal CLK1 controls the fifth transistor M5 to be turned on or turned off, while the drain of the fifth transistor M5 is connected to the gate of the fourth transistor M4, and at the same time, the third transistor M3 and the fourth transistor M4 form an inverter, and these three transistors can control the potential at the pull-up control node A, so as to control the first transistor M1 to be turned on or turned off and further control the high voltage signal at the first voltage signal terminal V1 to be inputted to the output signal terminal OUTPUT.

Further, the pull-down control module 3 can comprise: a sixth transistor M6, whose gate is connected to the second clock signal terminal CLK2, first electrode is connected to the pull-down control node B, and second electrode is connected to the signal input terminal INPUT (STV); this structure can control the potential at the pull-down control node B by controlling the signals at the second clock signal terminal CLK2 and the signal input terminal INPUT, so as to control the second transistor M2 to be turned on or turned off and further control the signal at the first clock signal terminal CLK1 to be inputted to the signal output terminal OUTPUT.

The shift register unit, the gate driving circuit and the display device in the embodiments of the present disclosure can ameliorate the potential suspension problem existing in some key points in the shift register unit, so as to improve stability of the output signal.

Figure 4:
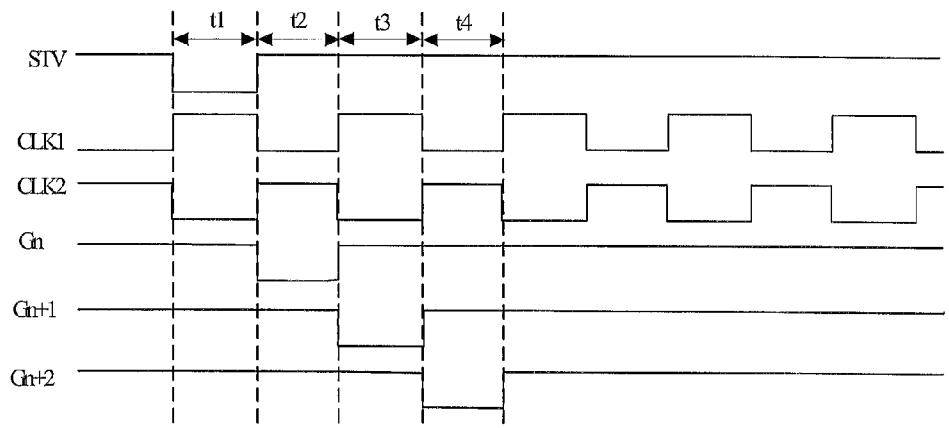
FIG. 4 is a signal timing when a shift register unit operates in an embodiment of the present disclosure.

The shift register unit as shown in FIG. 3 comprises six P-type transistors and one capacitor C (6T1C). The quantity of the elements and devices used in the shift register unit of such a structure is relatively small, which is convenient for designing and manufacturing. A signal timing when such a shift register unit is operating can be as shown in FIG. 4, wherein the first clock signal CLK1 and the second clock signal CLK2 have the same period and reverse phases. The operation principle of the shift register unit in the embodiments of the present disclosure will be described in detail according to four time periods. In the embodiments of the present disclosure, the first voltage signal terminal V1 can be inputted a high level VGH, the second voltage signal terminal V2 can be inputted a low level VGL, and the signal input terminal INPUT can be inputted a frame start signal STV First time period t1: the second clock signal CLK2 and the frame start signal STV are at a low level (turn-on signal) to make the sixth transistor M6 turned on, the frame start signal STV will be inputted to the pull-down control node B through the sixth transistor M6 and stored in the capacitor C. At this time, since the first clock signal CLK1 is at a high level (turn-off signal), the fifth transistor M5 is turned off, and the drain of the fifth transistor M5 is connected to the gate of the fourth transistor M4, and thus the fourth transistor M4 is turned off.

In the inverter composed of the third transistor M3 and the fourth transistor M4, since the fourth transistor M4 is in a turn-off state, the potential at the pull-up control node A of the output terminal of the inverter is a low voltage turn-on potential of the low levels VGL-VTH (VTH is a threshold voltage of the fourth transistor M4) to make the first transistor M1 turned on, and at this time, the high level VGH can be outputted to the signal output terminal OUTPUT of the shift register unit through the first transistor M1.

Second time period t2: the first clock signal CLK1 is at the low level (turn-on signal), and the second clock signal CLK2 and the frame start signal STV are at the high level (turn-off signal), and at this time, since the turn-on potential of the previous clock stored at the pull-down control node B turns on the second transistor M2, the first clock signal CLK1 is inputted to the signal output terminal OUTPUT; at the same time, the first clock signal CLK1 turns on the fifth transistor M5, then the voltage turn-on signal at the pull-down control node B can be inputted to the gate of the fourth transistor M4 through the fifth transistor M5, so that the first transistor M1 is turned off. In this way, the signal at the signal output terminal OUTPUT can be guaranteed to be stable.

Third time period t3: the first clock signal CLK1 and the frame start signal STV are at the high level (turn-off signal), and the second clock signal CLK2 is at the low level (turn-on signal), so that the sixth transistor M6 is turned on, and the potential at the pull-down control node B at this time is the frame start signal STV at the high level, so that the second transistor M2 is in the turn-off state, and the potential at the pull-down control node B is stored in the capacitor C. In the meantime, the first clock signal CLK1 is also at the high level (turn-off signal) to make the fifth transistor M5 turned off, and thus the potential at the pull-up control node A of the output terminal of the inverter is the low voltage turn-on signal of the low levels VGL-VTH, so that the first transistor M1 is again in the turn-on state. At this time, the high level VGH can be outputted to the signal output terminal OUTPUT of the shift register unit through the first transistor M1.

Fourth time period t4: the second clock signal CLK2 and the frame start signal STV are at the high level, and the first clock signal CLK1 is at the low level, so that the fifth transistor M5 is turned on, and at this time, the high level kept at the pull-down control node B at the previous phase can be inputted to the gate of the fourth transistor M4 through the fifth transistor M5, so as to make the fourth transistor M4 turned off, and at this time, the potential at the pull-up control node A of the output terminal of the inverter is still kept the characteristic at the previous phase, i.e., outputting the low voltage turn-on signals of the low levels VGL-VTH, so as to make the first transistor M1 turned on, and at this time, the high level VGH can be outputted to the signal output terminal OUTPUT of the shift register unit through the first transistor M1.

The shift register unit of the embodiment of the present disclosure does not have the potential suspension phenomenon at the node through signal feedback of the above four time periods, so as to avoid instability of the output signal.

It is needed to specify that the shift register unit in the embodiments of the present disclosure is specified by taking the first to sixth transistors adopting P-type transistors as an example. The signal timing when such shift register unit operates can be as shown in FIG. 4. In particular, by taking the n-th stage of shift register unit as an example, during the first time period t1, the signal input terminal INPUT is inputted the frame start signal. STV at a low level, the first clock signal CLK1 is at the high level at this time, the second clock signal CLK2 is at the low level, and the signal Gn outputted from the signal output terminal OUTPUT of present stage is at the high level; during the second time period t2, the STV signal and the CLK2 signal are at the high level, the CLK1 signal is at the low level, and at this time, the signal Gn outputted from the signal output terminal OUTPUT of present stage is at the low level, so as to complete the signal output of the present stage of shift register unit; during the third time period t3, the STV signal and the CLK1 signal are at the high level, the CLK2 signal is at the low level, the signal Gn outputted from the signal output terminal OUTPUT of present stage is at the high level at this phase, and the signal Gn+1 outputted from the signal output terminal OUTPUT of the next stage of shift register unit is at the low level at this phase, so as to realize the timing scanning of the gate driving signal; during the fourth time period t4, the STV signal and the CLK2 signal are at the high level, the CLK1 signal is at the low level, and the signal Gn outputted from the signal output terminal OUTPUT of present stage is at the high level When the first to sixth transistors adopt N-type transistors, the above function can also be realized by performing phase inverting processing on the frame start signal STV and the clock signals CLK1 and CLK2 respectively, referring to the descriptions of the above respective time periods for the specific driving principle, and thus no further description is given herein.

Figure 5:
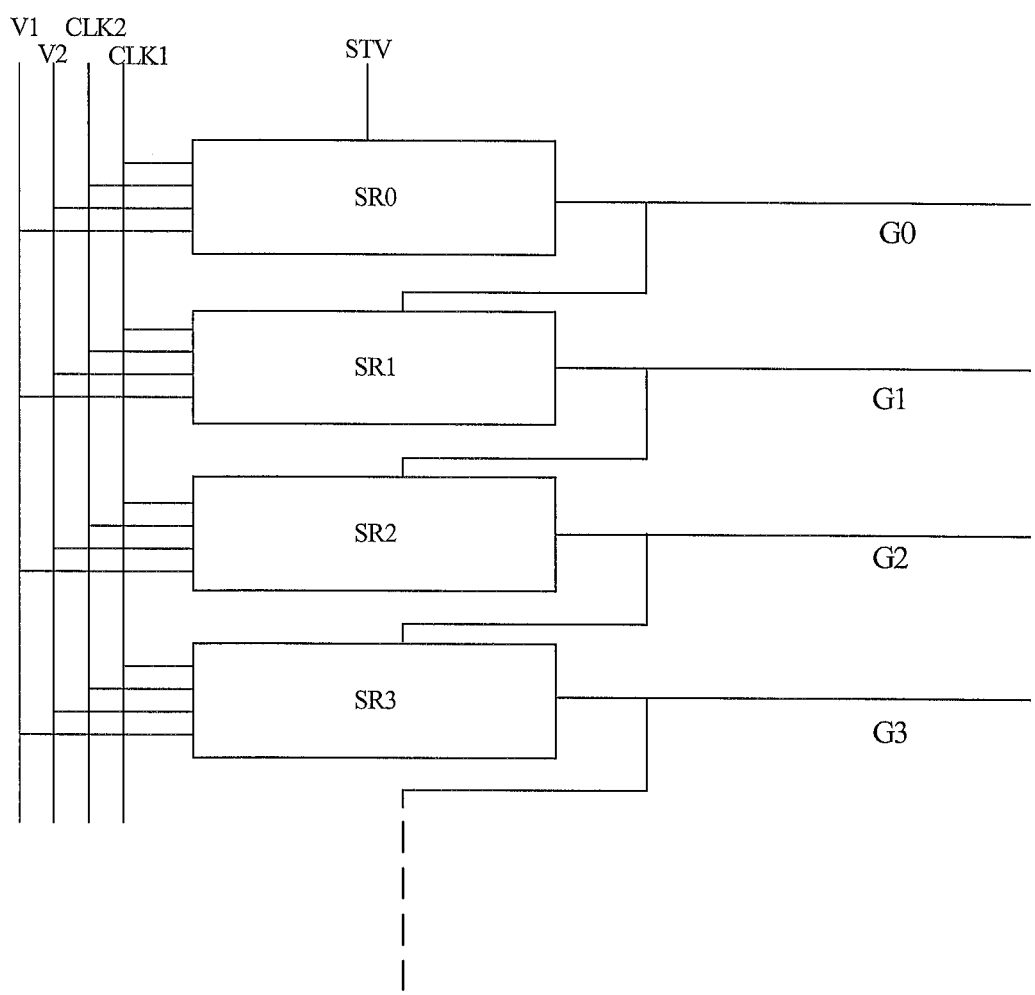
FIG. 5 is a schematic diagram of a structure of a gate driving circuit in an embodiment of the present disclosure.

A gate driving circuit of the embodiment of the present disclosure as shown in FIG. 5 comprises a plurality of shift register units connected in series. Except the last stage of shift register unit, the signal output terminal OUTPUT of present stage of each of the other shift register units $SR_n$ is connected to a signal input terminal INPUT of an adjacent next stage of shift register unit $SR_{n+1}$.

In the gate driving circuit as shown in FIG. 5, the signal input terminal INPUT of a first stage shift register unit SR0 is inputted a frame start signal STV.

The gate driving circuit in the embodiment of the present disclosure comprises stage shift register units and can ameliorate the potential suspension problem existing in some key points in the shift register unit, so as to improve stability of the output signal.

An embodiment of the present disclosure further provides a display device which can comprises the above gate driving circuit.

Herein, the structure of the shift register unit comprised in the gate driving circuit has been described in detail in the previous embodiments, and thus no further description is given herein.

The display device of the embodiment of the present disclosure comprises a gate driving circuit which further comprises the shift register unit, which can ameliorate the potential suspension problem existing in some key points in the shift register unit, so as to improve stability of the output signal.

The above descriptions are just specific implementations of the present disclosure, but the protection scope of the present disclosure is not limited thereto. Alternations or replacements that can be easily conceived by those skilled in the art that are familiar with the technical field within the technical scope disclosed in the present disclosure can be included within the protection scope of the present disclosure. Therefore, the protection scope of the present disclosure shall be subject to the protection scope of the claims.

What is claimed is:

1. A shift register unit comprising:
   a pull-up control module being connected to a first clock signal terminal, a first voltage signal terminal, a second voltage signal terminal and a pull-up control node, and configured to control a potential at the pull-up control node;
   a pull-up module being connected to the pull-up control node, the first voltage signal terminal and a signal output terminal of present stage and configured to pull up a signal outputted from the signal output terminal of present stage to a high potential when the pull-up module is controlled by a signal at the pull-up control node to be in a turn-on state and a signal at the first voltage signal terminal is at a high level;
   a pull-down control module being connected to a second clock signal terminal, a signal input terminal and a pull-down control node and configured to control a potential at the pull-down control node;
   a pull-down module being connected to the pull-down control node, the first clock signal terminal and the signal output terminal of present stage and configured to pull down the signal outputted from the signal output terminal of present stage to a low potential when the pull-down module is controlled by the signal at the pull-down control node to be in a turn-on state and a signal outputted from the first clock signal terminal is at a low level,
   wherein the pull-up control module comprises:
   a third transistor, whose gate and first electrode are connected to the second voltage signal terminal, and second electrode is connected to the pull-up control node;
   a fourth transistor, whose first electrode is connected to the pull-up control node, and second electrode is connected to the first voltage signal terminal; and
   a fifth transistor, whose gate is connected to the first clock signal terminal, first electrode is connected to the pull-down control node, and second electrode is connected to a gate of the fourth transistor.

2. The shift register unit according to claim 1, wherein the pull-up module comprises:
   a first transistor, whose gate is connected to the pull-up control node, first electrode is connected to the present stage of signal output terminal, and second electrode is connected to the first voltage signal terminal.

3. The shift register unit according to claim 1, wherein the pull-down module comprises:
   a second transistor, whose gate is connected to the pull-down control node, first electrode is connected to the first clock signal terminal, and second electrode is connected to the present stage of signal output terminal; and
   a capacitor, connected in parallel between the gate and second electrode of the second transistor.

4. The shift register unit according to claim 1, wherein the pull-down control module comprises:
   a sixth transistor, whose gate is connected to the second clock signal terminal, first electrode is connected to the pull-down control node, and second electrode is connected to the signal input terminal.

5. A gate driving circuit comprising a plurality of shift register units according to claim 1 connected in series, wherein
   except for a last stage of shift register unit, a signal output terminal of present stage for each of the other shift register units is connected to an signal input terminal of its adjacent next stage of shift register unit.

6. The gate driving circuit according to claim 5, wherein the signal input terminal of the first stage of shift register unit is inputted a frame start signal.

7. A display device comprising the gate driving circuit according to claim 5.

8. The gate driving circuit according to claim 5, wherein the pull-up module comprises:
   a first transistor, whose gate is connected to the pull-up control node, first electrode is connected to the present stage of signal output terminal, and second electrode is connected to the first voltage signal terminal.

9. The gate driving circuit according to claim 5, wherein the pull-down module comprises:
   a second transistor, whose gate is connected to the pull-down control node, first electrode is connected to the first clock signal terminal, and second electrode is connected to the present stage of signal output terminal; and
   a capacitor, connected in parallel between the gate and second electrode of the second transistor.

10. The gate driving circuit according to claim 8, wherein the pull-down module comprises:
    a second transistor, whose gate is connected to the pull-down control node, first electrode is connected to the first clock signal terminal, and second electrode is connected to the present stage of signal output terminal; and
    a capacitor, connected in parallel between the gate and second electrode of the second transistor.

11. The gate driving circuit according to claim 5, wherein the pull-down control module comprises:
    a sixth transistor, whose gate is connected to the second clock signal terminal, first electrode is connected to the pull-down control node, and second electrode is connected to the signal input terminal.

12. The gate driving circuit according to claim 8, wherein the pull-down control module comprises:
- a sixth transistor, whose gate is connected to the second clock signal terminal, first electrode is connected to the pull-down control node, and second electrode is connected to the signal input terminal.

13. The gate driving circuit according to claim 9, wherein the pull-down control module comprises:
- a sixth transistor, whose gate is connected to the second clock signal terminal, first electrode is connected to the pull-down control node, and second electrode is connected to the signal input terminal.

\* \* \* \* \*